United States Patent
Ifuku et al.

(10) Patent No.: US 7,301,261 B2
(45) Date of Patent: Nov. 27, 2007

(54) DIELECTRIC ELEMENT, PIEZOELECTRIC ELEMENT, INK JET HEAD AND INK JET RECORDING APPARATUS AND MANUFACTURING METHOD OF SAME

(75) Inventors: Toshihiro Ifuku, Yokohama (JP); Takanori Matsuda, Yokohama (JP); Katsumi Aoki, Yokohama (JP); Kenichi Takeda, Yokohama (JP); Kiyotaka Wasa, 7-27, 2-chome, Chiyogaoka, Nara-shi, Nara-ken (JP)

(73) Assignees: Canon Kabushiki Kaisha, Tokyo (JP); Kiyotaka Wasa, Nara (JP)

( * ) Notice: Subject to any disclaimer, the term of this patent is extended or adjusted under 35 U.S.C. 154(b) by 269 days.

(21) Appl. No.: 11/062,619

(22) Filed: Feb. 23, 2005

(65) Prior Publication Data

US 2005/0189849 A1 Sep. 1, 2005

(30) Foreign Application Priority Data

Feb. 27, 2004 (JP) .............................. 2004-055549

(51) Int. Cl.
*H01L 41/00* (2006.01)

(52) U.S. Cl. ..................................... 310/358

(58) Field of Classification Search ........ 310/358–359, 310/328, 311, 331, 364; 428/323, 701, 7; H01L 41/08
See application file for complete search history.

(56) References Cited

U.S. PATENT DOCUMENTS

| | | | |
|---|---|---|---|
| 5,576,564 A | 11/1996 | Satoh et al. | |
| 6,653,211 B2 | 11/2003 | Unno et al. | |
| 6,841,490 B2 | 1/2005 | Unno et al. | |
| 6,854,832 B2 | 2/2005 | Matsuda | |
| 6,919,126 B2 * | 7/2005 | Wu et al. | 428/323 |
| 6,927,084 B2 | 8/2005 | Fukui et al. | |
| 7,053,526 B2 | 5/2006 | Unno et al. | |
| 2002/0076875 A1 | 6/2002 | Wasa et al. | |
| 2002/0140320 A1 | 10/2002 | Unno et al. | |
| 2004/0066116 A1 | 4/2004 | Matsuda et al. | |
| 2004/0155559 A1 | 8/2004 | Ifuku et al. | |
| 2004/0207695 A1 | 10/2004 | Aoto et al. | |
| 2005/0127780 A1 | 6/2005 | Ifuku et al. | |
| 2005/0168112 A1 * | 8/2005 | Aoki et al. | 310/358 |
| 2005/0219793 A1 * | 10/2005 | Matsuda et al. | 361/321.2 |
| 2006/0072282 A1 * | 4/2006 | Uchida et al. | 361/320 |

FOREIGN PATENT DOCUMENTS

| | | |
|---|---|---|
| CN | 1380187 A | 11/2002 |
| EP | 1 367 658 A1 | 12/2003 |
| JP | 7-202295 | 8/1995 |
| JP | 8-116103 | 5/1996 |
| JP | 10-93029 | * 4/1998 |

* cited by examiner

*Primary Examiner*—Darren Schuberg
*Assistant Examiner*—Karen Addison
(74) *Attorney, Agent, or Firm*—Fitzpatrick, Cella, Harper & Scinto

(57) ABSTRACT

A dielectric element having a dielectric layer provided between an upper electrode layer and a lower electrode layer, wherein the dielectric layer has a first dielectric layer and a second dielectric layer mutually different in composition, and composition of at least one component of the first dielectric layer changes as to a thickness direction of the first dielectric layer in proximity to a boundary between the first dielectric layer and the second dielectric layer.

16 Claims, 8 Drawing Sheets

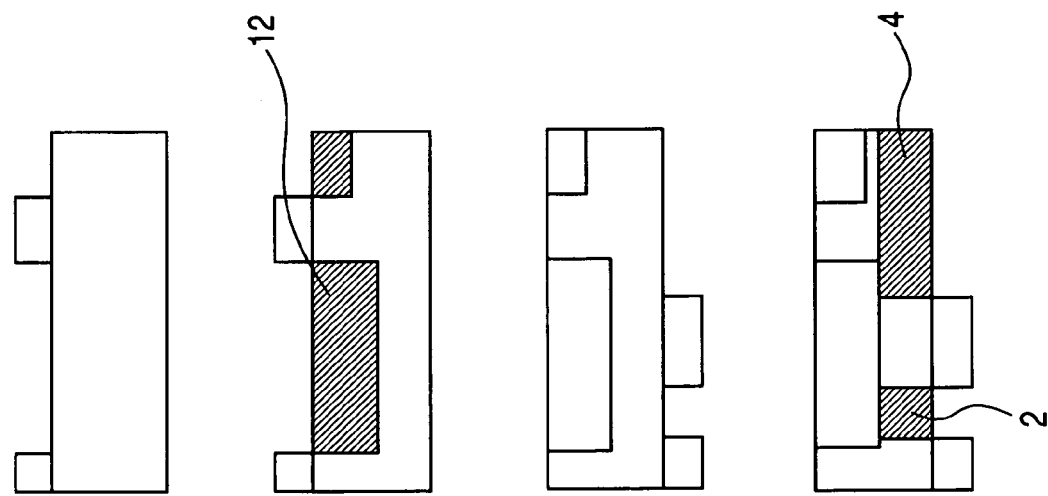
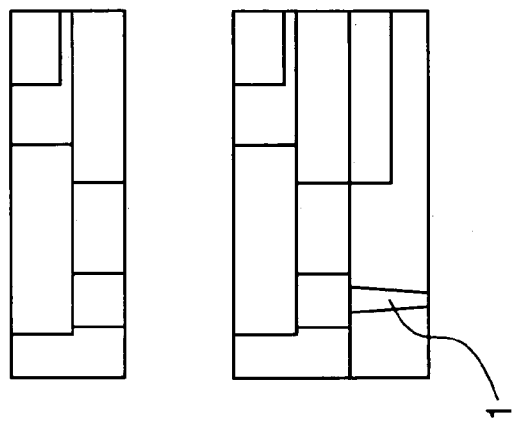
FIG. 6A  FIG. 6B  FIG. 6C  FIG. 6D  FIG. 6E  FIG. 6F

DIELECTRIC ELEMENT, PIEZOELECTRIC ELEMENT, INK JET HEAD AND INK JET RECORDING APPARATUS AND MANUFACTURING METHOD OF SAME

BACKGROUND OF THE INVENTION

1. Field of the Invention

The present invention relates to a dielectric element and a piezoelectric (electrostrictive) element capable of applications as MEMS in particular, such as a capacitor, a sensor, a transducer and an actuator as well as an ink jet head and an ink jet recording apparatus using the piezoelectric element. The present invention further relates to a manufacturing method thereof.

2. Related Background Art

While a dielectric material of a high dielectric constant as a capacitor is in demand, thinning of ceramics materials such as $BaTiO_3$ is underway for the sake of miniaturizing the capacitor. However, the dielectric constants of the ceramics materials such as $BaTiO_3$ and $Pb(Zr, Ti)O_3$ are only 1500 or so, and they often become electronic devices of defective characteristics when problems of improper sintering and a deficient structure of an interface are further added thereto by thinning them.

As for a piezoelectric, researches in the fields of MEMS and piezoelectric applications are widely conducted in recent years so that a thin-film piezoelectric element of good characteristics is expected. The piezoelectric element is an element that expands and contracts when having its piezoelectric layer sandwiched by electrodes and having an electric field applied thereto, and is adaptable to a motor, an ultrasonic motor, an actuator and so on.

Materials mainly used in the application fields are PZT materials which were discovered about 50 years ago. Sintering temperature of the PZT materials is over 1100° C., and so material development is underway by using a sol-gel method, a sputter technique, an MBE method, a PLD method, a CVD method and so on in order to adapt them as a thin-film element. In the case of applying them as a thin film, however, there may be a problem that physical destruction in a film or on a film interface is apt to occur. For that reason, attempts are made to devise a crystal structure of the piezoelectric layer so as to obtain a large piezoelectric constant and good pressure tightness. An example of using an orientation film by sputtering (001) as an ink jet head is described in Japanese Patent Application Laid-Open No. H08-116103. This method provides oriented electrodes on a substrate, and controls a crystal structure of a piezoelectric film by having a $PbTiO_3$ layer with no Zr intervening between the piezoelectric film and the electrodes. However, this method has a problem that the dielectric constant of the $PbTiO_3$ layer is lower than that of PZT of the piezoelectric film and so electric field intensity applied to a PZT layer becomes lower in the case of applying the electric field.

To realize a piezoelectric constant exceeding PZT ceramics, single-crystallization of relaxer materials has been studied, and a single-crystal substance in bulk has been obtained by a fusion method with a large piezoelectric constant thereof reported. A report on these thin-film-formed relaxer materials was made at FMA (Ferroelectrics Meeting of Application) in 2002. However, it is not a status in which the large piezoelectric constant can be obtained in a stable state. U.S. Pat. No. 5,804,907 describes use of a relaxer single-crystal material as the actuator. However, it has the problems that a method of creating the element is not concretely described and that the single-crystal material is created by the fusion method (TSSG method) and so a thin film of 50 μm or less cannot be handled.

SUMMARY OF THE INVENTION

An object of the present invention is to provide a dielectric element and a piezoelectric element having solved the problems and a manufacturing method thereof. Another object is to provide an actuator of an ink jet head, etc. and an ink jet recording apparatus using this piezoelectric element.

A first dielectric element according to the present invention is a dielectric element having a dielectric layer provided between an upper electrode layer and a lower electrode layer, wherein the dielectric layer has a first dielectric layer and a second dielectric layer mutually different in composition, and the composition of at least one component of the first dielectric layer changes as to a thickness direction of the first dielectric layer in proximity to a boundary between the first dielectric layer and the second dielectric layer.

A second dielectric element according to the present invention is the dielectric element having a dielectric layer provided between an upper electrode layer and a lower electrode layer, wherein the dielectric layer has a first dielectric layer and a second dielectric layer, and the second dielectric layer is a layer mainly composed of an oxide formed by four or more metal element components while the first dielectric layer is mainly composed of the oxide formed by remaining three or more components of the metal element components because of substantial nonexistence of at least one component of the four or more metal element components in proximity to one of the upper electrode layer and the lower electrode layer, and composition of at least one component changes as to a thickness direction of the first dielectric layer in proximity to a boundary of the second dielectric layer.

A third dielectric element according to the present invention is the dielectric element having a dielectric layer provided between an upper electrode layer and a lower electrode layer, wherein the dielectric layer has a first dielectric layer and a second dielectric layer, and a major component of the first dielectric layer is an oxide substantially including no Ti element in proximity to one of the upper electrode layer and the lower electrode layer, and composition of the Ti component changes as to a thickness direction of the first dielectric layer in proximity to a boundary of the second dielectric layer while the major component of the second dielectric layer is an oxide having the Ti element.

A fourth dielectric element according to the present invention is a dielectric element having a dielectric layer provided between an upper electrode layer and a lower electrode layer, wherein the dielectric layer has a first dielectric layer and a second dielectric layer, and composition of the first dielectric layer changes as to a thickness direction of the first dielectric layer while dielectric constants of the first dielectric layer and the second dielectric layer at 25° C. are mutually different.

The piezoelectric element according to the present invention is the piezoelectric element comprising one of the first to third dielectric elements.

The ink jet head and an ink jet recording apparatus according to the present invention comprise the piezoelectric element having the above configuration.

The present invention is the dielectric element and piezoelectric element having at least two layers of each of the first dielectric layer and the second dielectric layer laminated thereon.

A first manufacturing method of a dielectric according to the present invention is the manufacturing method of a dielectric having steps of: forming a first dielectric layer mainly composed of an oxide comprising two or more components and having a layer area in which at least one component constituting the oxide changes its ratio of composition to other components of the composition in a layer thickness direction; and forming a second dielectric layer of which composition is substantially even in the layer thickness direction.

A second manufacturing method of a dielectric according to the present invention is the manufacturing method of a dielectric having steps of: forming a first dielectric layer mainly composed of an oxide having composition comprising two or more components and having a layer area in which at least one component constituting the oxide changes its ratio of composition to other components of the composition in a layer thickness direction; and forming a second dielectric layer on the first dielectric layer from a material component composed of an oxide having composition consisting of two or more kinds of components including an element of the slanted component and increased by 50 to 150 mole percent to a stoichiometric composition of the oxide of the element of the slanted component.

A first manufacturing method of a dielectric element according to the present invention is the manufacturing method of a dielectric element of a laminated structure having a dielectric layer provided between an upper electrode layer and a lower electrode layer, comprising steps of: forming a first dielectric layer at least having a layer in which at least one component changes its ratio of composition to other components of the composition in a layer thickness direction on a lower electrode; and forming a second dielectric layer having composition including a component of the slanted composition at a fixed rate, wherein a dielectric constant ∈1 of the first dielectric layer at 25° C. and a dielectric constant ∈2 of the second dielectric layer at 25° C. are different.

A second manufacturing method of a dielectric element according to the present invention is the manufacturing method of a dielectric element of a laminated structure having a dielectric layer provided between an upper electrode layer and a lower electrode layer, comprising a step of forming the dielectric layer mainly composed of first and second oxides on the lower electrode layer, wherein the second dielectric layer is mainly composed of an oxide having composition including four or more kinds of metal element, and at least a part of the first dielectric layer is formed by a layer mainly composed an oxide formed by four or more metal element components so that at least one metal element component changes its ratio of composition to other components in a layer thickness direction.

According to the present invention, it is possible to provide a relaxer dielectric layer and a relaxer piezoelectric layer which are single-crystallized, single-orientation-crystallized or preference-orientation-crystallized and also provide the manufacturing method thereof. It is possible to provide the dielectric, piezoelectric, ink jet head and ink jet recording apparatus of good characteristics capable of a low-voltage drive by using them.

BRIEF DESCRIPTION OF THE DRAWINGS

FIGS. 6A, 6B, 6C, 6D, 6E and 6F are schematic views showing the manufacturing process of a piezoelectric element;

FIG. 11 is a diagram describing the composition of the slanted structure portion of the present invention.

DESCRIPTION OF THE PREFERRED EMBODIMENTS

Figure 1:
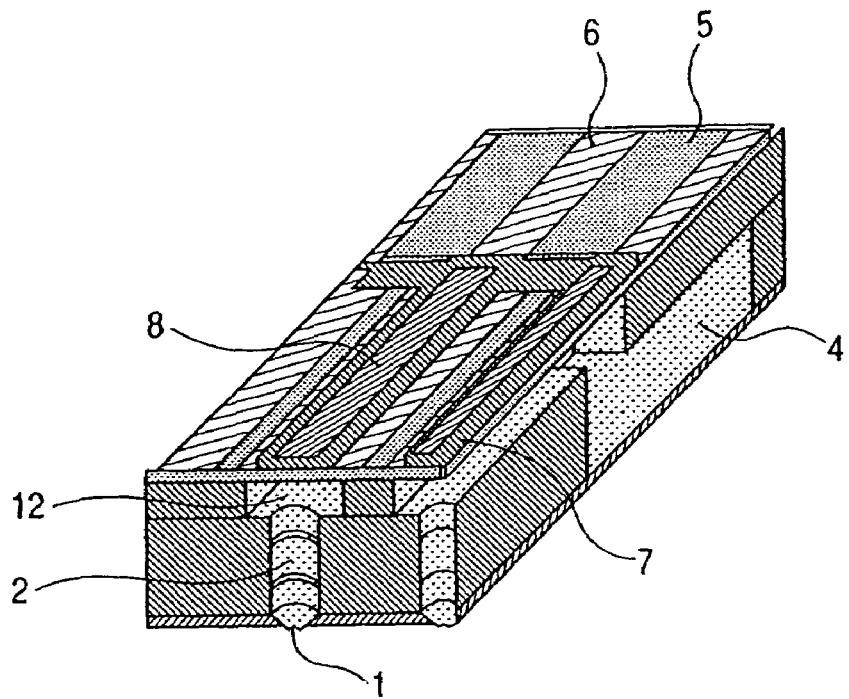
FIG. 1 is a schematic view of an ink jet head.

According to the configuration of the first dielectric element previously described, it is possible, as crystal controllability improves and electric field loss decreases, to activate a dielectric and a piezoelectric with good characteristics. According to the configuration of the second dielectric element previously described, it is possible to improve consistency of a crystal lattice with a second dielectric layer without increasing film thickness of a first dielectric layer and control crystalline property of the second dielectric layer so as to obtain the dielectric and a piezoelectric of good characteristics on a substrate. It is also possible to improve dielectric characteristics and piezoelectric characteristics of the first layer so as to improve characteristics of the elements as a whole.

Here, a slanted structure means a structure in which a specific element constituting a layer has increased or decreased against another element in a film thickness direction. In particular, it is desirable to have the structure in which the element has increased toward the second dielectric layer side, and a maximum ratio of composition of this component changing its composition (concentration) should desirably be the ratio of composition of the second layer or smaller.

According to the present invention, "not substantially existent or including" means the case where an amount of the element or component is that of impurities included and including it does not impair desirable characteristics, which is in the scope of the present invention and does not deviate from the gist of the present invention.

In the first to third configurations of the dielectric elements previously described, it is desirable that it is $t_2 > t_1$ in the case where the film thickness of the first dielectric layer is $t_1$ and that of the second dielectric layer is $t_2$ in the dielectric layer. It should desirably be $t_2 > 2 \times t_1$, and preferably $t_2 > 5 \times t_1$. As the first dielectric layer becomes thinner, the ratio of the second dielectric layer for acting as a main functional layer increases so that the characteristics of the device are improved. As for concrete film thicknesses, $t_1$ is 5 to 800 nm, preferably 8 to 500 nm, and $t_2$ is 100 to 8000 nm, and preferably 90 to 5000 nm. The film thickness of the layer not substantially including a Ti element of the first dielectric layer should be 1 to 200 nm, and preferably 2 to 100 nm. The film thickness of the entire dielectric layer should be 100 nm to 10 μm. It should preferably be 150 nm to 5 μm. In the case of using the dielectric layer for a piezoelectric application, it should preferably be 0.5 to 10 μm, and preferably 0.8 to 5 μm. The present invention is the dielectric wherein dielectric constants of the first dielectric layer and the second dielectric layer at 25° C. are different and a difference between lattice constants of the first and second dielectric layers on a boundary surface is within ±4 percent.

As for the dielectric constants, it is desirable that a dielectric constant ∈1 of the first dielectric layer at 25° C. and a dielectric constant ∈2 of the second dielectric layer at 25° C. be different so as to be 0.2≦∈1/∈2≦5. A manufacturing method described below reduces a deviation between the lattice constants of the first and second dielectric layers on the boundary surface and stress of the entire film so that problems such as film peeling and warpage of the element can be solved.

In addition to the above configurations, according to the present invention, the oxide as a major component forming the dielectric layer should preferably be a perovskite oxide. In particular, the second dielectric layer is the perovskite oxide including at least four metal element components as previously described. This broadens a preference region of the first dielectric layer so that it becomes easier to obtain the dielectric layer oriented on the electrode.

According to the present invention, the dielectric layer is mainly composed of the oxide. However, the configuration of the dielectric layer includes the one composed only of a predetermined oxide and the one including impurities other than the predetermined oxide and additives added as required to the extent of not impairing a characteristic such as a desired dielectric constant obtained by including the predetermined oxide.

The perovskite oxide used for the first and second dielectric layers should preferably be a relaxer oxide. As for a reason that the relaxer oxide is more desirable than a PZT oxide, it is preferable because a layer having a higher dielectric constant and/or stronger piezoelectric and electrostrictive characteristics can be obtained.

As for the components of the relaxer oxide, it is characterized by having at least one kind of component selected from Pb, Ti, Nb, Mg, Zn, Sc and Ni. To be more precise, they are PMN (Pb(Mg, Nb)$O_3$), PZN (Pb(Zn, Nb)$O_3$), PSN (Pb(Sc, Nb)$O_3$), PNN (Pb(Ni, Nb)$O_3$), PIN (Pb(In, Nb)$O_3$), PST (Pb(Sc, Ta)$O_3$), PMN-PT (Pb(Mg, Nb)$O_3$—PbTi$O_3$), PZN-PT (Pb(Zn, Nb)$O_3$-ObTi$O_3$), PNN-PT (Pb(Ni, Nb)$O_3$—PbTi$O_3$), PSN-PT (Pb(Sc, Nb)$O_3$—PbTi$O_3$), PIN-PT (Pb(In, Nb)$O_3$—PbTi$O_3$) and PST-PT (Pb(Sc, Ta)$O_3$—PbTi$O_3$). A ratio of composition thereof may be a component ratio including Pb by a slightly excessive percentage. To be more precise, it may be excessively included up to 1.35 against a stoichiometric mixture ratio. It is possible, by excessively including Pb, to obtain the dielectric and piezoelectric (hereafter, the piezoelectric also includes meaning of the electrostrictive) which are stable and of good characteristics. And oxygen components may also have their composition changed to the extent that it does not have negative effects on the crystalline property and the dielectric constant.

As for the relaxer oxides of the second dielectric layer, to be more precise, they are an oxide indicated by [Pb(Mg$_{1/3}$Nb2/3)$O_3$]x-[PbTi$O_3$]y wherein x is 0.5 to 0.8 and y is 0.2 to 0.5, an oxide indicated by [Pb(Zn$_{1/3}$Nb$_{2/3}$)$O_3$]x-[PbTi$O_3$]y wherein x is 0.7 to 0.97 and y is 0.03 to 0.3, an oxide indicated by [Pb(Sc$_{1/2}$Nb$_{1/2}$)$O_3$]x-[PbTi$O_3$]y wherein x is 0.4 to 0.7 and y is 0.3 to 0.6, an oxide indicated by [Pb(Ni$_{1/3}$Nb$_{2/3}$)$O_3$]x-[PbTi$O_3$]y wherein x is 0.6 to 0.9 and y is 0.1 to 0.4, an oxide indicated by [Pb(In$_{1/2}$Nb$_{1/2}$)$O_3$]x-[PbTi$O_3$]y wherein x is 0.2 to 0.8 and y is 0.2 to 0.7, and an oxide indicated by [Pb(Sc$_{1/2}$Ta$_{1/2}$)$O_3$]x-[PbTi$O_3$]y wherein x is 0.4 to 0.8 and y is 0.2 to 0.6. It may also be the composition in which Pb(Zr, Ti)$O_3$ and Zr are added as an equivalent of the above PbTi$O_3$. However, the former is preferable. It is because, if the Zr component is 0.65 or more in a Zr/(Zr+Ti) ratio, there is a possibility that control of crystallization may become difficult and the entire composition may be displaced due to an increase in elemental components. To indicate the composition of the above PbTi$O_3$ as Pb$_{(1-a)}$A$_a$Ti$O_3$, the element other than Pb is included as an element A in a site A of a perovskite structure. The element A should preferably be an element selected from La, Ca and Sr. In particular, La is a desirable form, and there is an effect of improving the crystalline property by including La. It can be considered that, while crystallization temperature rises by having the Ti element included in the second layer, crystallization is facilitated for the sake of curbing the rise. Here it is 0 ≦a ≦0.7, and preferably 0≦a ≦0.3.

The above materials are the perovskite oxides used for the second dielectric layer and second piezoelectric layer respectively. In the case where these are used for the second dielectric layer and piezoelectric layer, the first dielectric layer and piezoelectric layer should preferably have the compositions wherein the components of Pb$_{(1-a)}$A$_a$Ti$O_3$ (or Pb$_{(1-a)}$A$_a$(Zr, Ti)$O_3$) are substantially eliminated from the indicated oxide composition formulas respectively.

To be more precise, the major component of the first dielectric layer and piezoelectric layer is an oxide indicated by Pb(Mg$_{1/3}$Nb$_{2/3}$)$O_3$ the first dielectric layer includes a layer having the Ti element sidlingly increased in the slanted structure portion while the major component of the dielectric layer and piezoelectric layer in the second layer is an oxide indicated by [Pb(Mg$_{1/3}$Nb$_{2/3}$)$O_3$]x-[PbTi$O_3$]y, the major component of the first dielectric layer and piezoelectric layer is an oxide indicated by Pb(Zn$_{1/3}$Nb$_{2/3}$)$O_3$ the first dielectric layer includes a layer having the Ti element sidlingly increased in the slanted structure portion while the major component of the dielectric layer and piezoelectric layer in the second layer is an oxide indicated by [Pb(Zn$_{1/3}$Nb$_{2/3}$)$O_3$]x-[Pb$_{(1-a)}$A$_a$Ti$O_3$]y, the major component of the first dielectric layer and piezoelectric layer is an oxide indicated by Pb(Sc$_{1/2}$Nb$_{1/2}$)$O_3$ the first dielectric layer includes a layer having the Ti element sidlingly increased in the slanted structure portion while the major component of the dielectric layer and piezoelectric layer in the second layer is an oxide indicated by [Pb(Sc$_{1/2}$Nb$_{1/2}$)$O_3$]x-[Pb$_{(1-a)}$A$_a$Ti$O_3$]y, the major component of the first dielectric layer and first piezoelectric layer is an oxide indicated by Pb(Ni$_{1/3}$Nb$_{2/3}$)$O_3$ the first dielectric layer includes a layer having the Ti element sidlingly increased in the slanted structure portion while the major component of the dielectric layer and piezoelectric layer in the second layer is an oxide indicated by [Pb(Ni$_{1/3}$Nb$_{2/3}$)$O_3$]x-[Pb$_{(1-a)}$A$_a$Ti$O_3$]y, the major component of the first dielectric layer is an oxide indicated by Pb(In$_{1/2}$Nb$_{1/2}$)$O_3$ the first dielectric layer includes a layer having the Ti element sidlingly increased in the slanted structure portion while the major component of the dielectric layer in the second layer is an oxide indicated by [Pb(In$_{1/2}$Nb$_{1/2}$)$O_3$]x-[Pb$_{(1-a)}$A$_a$Ti$O_3$]y, and the major component of the first dielectric layer and first piezoelectric layer is an oxide indicated by Pb(Sc$_{1/2}$Ta$_{1/2}$)$O_3$ the first dielectric layer includes a layer having the Ti element sidlingly increased in the slanted structure portion while the major component of the dielectric layer and piezoelectric layer in the second layer is an oxide indicated by $[Pb(Sc_{1/2}Ta_{1/2})O_3]x\text{-}[Pb_{(1-a)}A_aTiO_3]y$. Here, the values of a, x and y are as previously described. The slanted element may be a La or Ca element other than the above Ti. It should preferably be Ti.

It may also be a combination such as an oxide layer having different major components between the first and second layers wherein, for instance, the first dielectric layer is $Pb(Mg_{1/3}Nb_{2/3})O_3$ and includes a layer having the Ti element sidlingly increased in the slanted structure portion, and the second dielectric layer is indicated by $[Pb(Zn_{1/3}Nb_{2/3})O_3]x\text{-}[Pb_{(1-a)}A_aTiO_3]y$, that is, the combination having two or more different site-B elements between oxide composition of the first dielectric layer and that of the second dielectric layer.

It is advantageous to provide the slanted structure portion to the first dielectric layer or piezoelectric layer in that a difference in the lattice constant is reduced to the dielectric constant of the second dielectric layer to improve the crystal controllability of the second dielectric layer and it becomes a film easily crystal-controlled on a metal film or a conductive oxide film which becomes the electrode.

For instance, in the case of film-forming the relaxer oxide equivalent to the aforementioned second dielectric layer on a $PbTiO_3$ film as has been conventionally performed, only a polycrystalline substance can be obtained and besides, it is apt to become a layer including a pyrochlore phase without obtaining the perovskite structure. Even if it is the polycrystalline substance, the dielectric constant of a $PbTiO_3$ layer is as low as below 100 in the case of applying an electric field, and it cannot be effectively applied to the second dielectric layers. Thus, it is not desirable as a device.

Each of the first and second dielectric layers according to the present invention can be a single-crystallized layer, a single-orientation layer or a preference-orientation layer independently. It is possible, in this configuration, to obtain the dielectric of which dielectric constant is controlled and piezoelectric characteristics are good. It also becomes the film having good resistance to pressure. A desirable crystalline orientation of the dielectric layer is (001), (110) or (111), and its desirable degree of orientation is 30 percent, and preferably 50 percent and further 70 to 100 percent. This 100 percent includes the meaning of a single-orientation film and an epitaxial single-crystallized film. These films may include the structure of a compatible phase and/or a twin crystal. They become the films of even better piezoelectric characteristics by including the structure of the compatible phase and/or twin crystal.

The dielectric element of the above configuration can be suitably used as the piezoelectric element. It is possible, by using the dielectric element, to obtain an ink jet head and an ink jet recording apparatus having good performance such as a discharge characteristic.

According to the present invention, it is also possible to render the dielectric element and piezoelectric element as a layer configuration sequentially laminating the layers combining the first and second dielectric layers. It is feasible, by taking this method, to obtain the film of good characteristics of which crystalline property does not collapse even when rendered thick-film.

Figure 8:
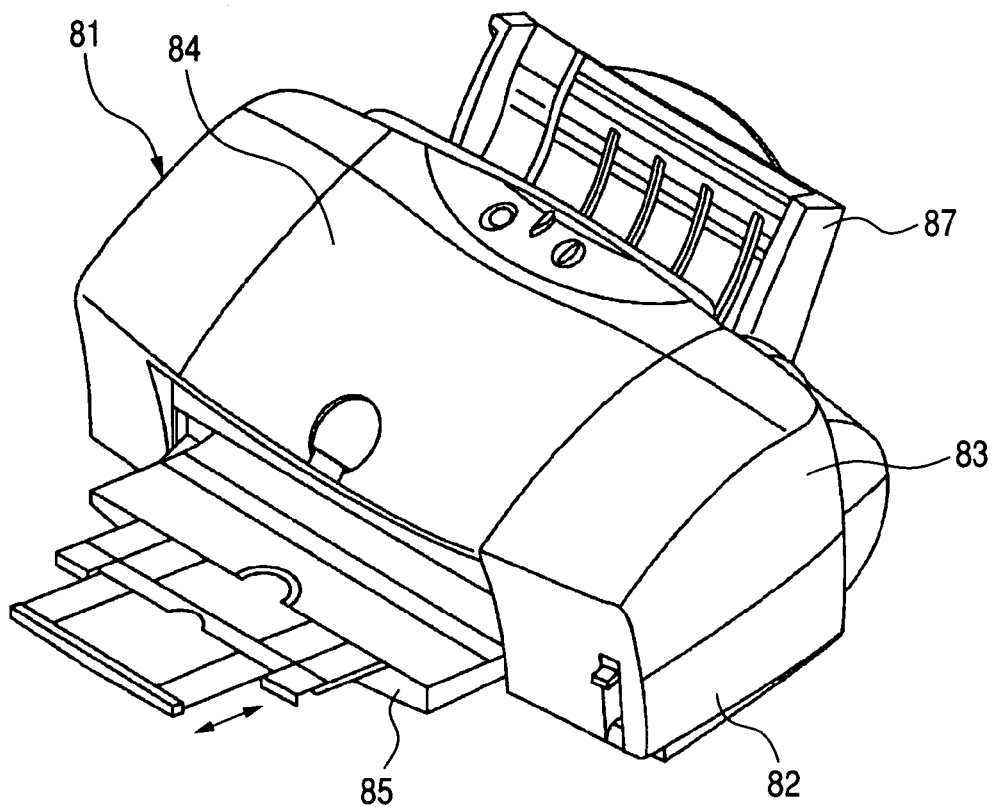
FIG. 8 is a bird's-eye view of an ink jet recording apparatus.
Figure 9:
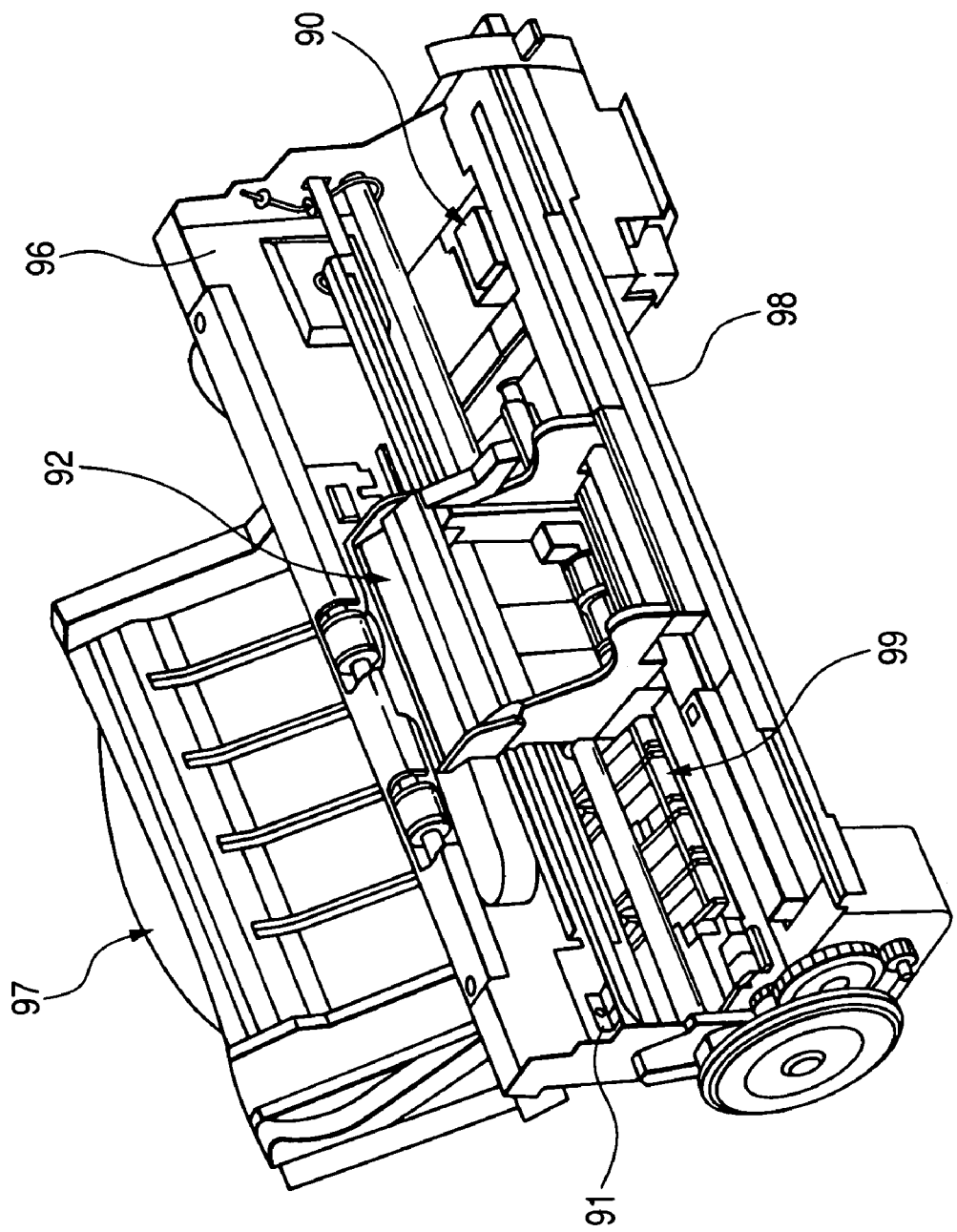
FIG. 9 is a schematic view of the ink jet recording apparatus excluding its exterior.

FIGS. 8 and 9 show schematic views of the ink jet recording apparatus using the ink jet head equipped with the piezoelectric element of the present invention. FIG. 9 shows an operating mechanism portion after removing the exterior of FIG. 8. The operating mechanism portion is comprised of an automatic feeding portion 97 for automatically feeding recording paper as a recording medium into the apparatus proper, a feeding portion 99 for leading the recording paper delivered from the automatic carrying portion 97 to a predetermined recording position and leading the recording paper from the recording position to an outlet 98, a recording portion for recording on the recording paper carried to the recording position, and a recovery portion 90 for performing a recovery process to the recording portion. The ink jet head of the present invention is placed on a carriage 92 to be used. FIG. 8 shows an example as a printer. However, the present invention may also be used for a fax machine, a complex machine, a copying machine or an industrial discharge apparatus.

Next, a manufacturing method of the present invention will be described.

A form of the manufacturing method of the dielectric according to the present invention has at least steps of forming the first dielectric layer having at least a layer with composition of one component of which ratio of composition to other components is the slanted structure and forming the second dielectric layer having substantially even composition. Another form of the manufacturing method of the dielectric according to the present invention has steps of forming the first layer having at least the layer with composition of one component of which ratio of composition to the other components is the slanted structure and forming the second dielectric layer from the material component in which the element of the component is increased by 50 to 150 mole percent compared to component composition of the dielectric layer. The dielectric layer should preferably be the perovskite oxide having the sites A and B, where the component increased by 50 to 150 mole percent should preferably be the site-B element.

Furthermore, the dielectric layer should preferably be the relaxer oxide. The materials described above can be used as the relaxer oxides.

It is possible to form at least one component from the material component increased by 50 to 150 mole percent compared to the component composition of the dielectric layer so as to form a dielectric film stably at a target ratio of composition. The layers to have their composition controlled by increasing amounts in particular are the slanted structure portion of the first dielectric layer and the second dielectric layer.

The method of forming a relaxer single-crystallized film, a single-orientation film or a preference-orientation film has not been conventionally known. It is possible to achieve this according to the present invention. For instance, in the case of forming a PMN-PT single-crystallized film by a sputter manufacturing method, deficiency of a PT component is apt to occur and the crystalline property is random. The present invention can effectively act on it to improve controllability of the ratio of composition, intricacy of the film and crystalline property of the film so as to obtain the element of which stress of the film is controlled.

A form of the manufacturing method of the dielectric element according to the present invention has a step of forming a composition slanted structure portion in the first dielectric layer formed on the electrodes, and a step of forming a relaxer dielectric layer having a metal oxide in which at least one metal element component is added to the composition of the first dielectric layer to form the second dielectric layer.

As an example of forming a PZT single-crystallized film, the crystalline property of the PZT film is improved by rendering the $PbTiO_3$ layer (PT layer) as a buffer layer in the aforementioned Japanese Patent Application Laid-Open No.

H08-116103. According to this method, the dielectric constant of the PT layer was as low as below 80, and in the case of providing the electric field to the PZT layer, the electric field applied to the PT layer became larger so that effective use as the element could not be achieved. For this reason, the PZT layer should have been film-formed by rendering the film thickness of the PT layer ultrathin. In this case, however, there was a problem that the crystalline property of the PZT layer became poor. In the case of using this method to form a PMN-PT film for instance, not only the same problem arises but a film of good crystalline property cannot be obtained even if the film thickness of the PT layer is increased. The present invention has solved these problems. For instance, it is possible to form a PMN layer and a layer in which PT component of PMN-PT is a slope composition as the first dielectric layer and form a relaxer crystal-oriented oxide layer such as a PMN-PT layer thereon as the second dielectric layer so as to solve the problems and obtain the material and element excellent in the dielectric property and piezoelectric property.

Another form of the manufacturing method of the dielectric according to the present invention has a step of forming the electrodes on the substrate, a step of forming the first dielectric layer at least having a layer with the ratio of composition of at least one component to the other components being the slanted structure and a step of forming the second dielectric layer having the composition including the component of the slanted composition in a fixed proportion, wherein a dielectric constant $\in 1$ of the first dielectric layer at 25° C. and a dielectric constant $\in 2$ of the second dielectric layer at 25° C. are different. It is possible to obtain the material and element excellent in the properties (dielectric constant and piezoelectric property) by this manufacturing method.

A further form of the manufacturing method of the dielectric element according to the present invention has the step of forming the electrodes on the substrate and the step of forming the first and second dielectric layers, wherein the second dielectric layer is formed by the oxide layer formed by the element having four or more metal element components while at least a part of the first dielectric layer is formed by the oxide layer formed by four or more kinds of metal element components so that the ratio of composition of at least one metal element component to the other components is slanted. This method also has the elements described above selected as the metal elements.

The present invention is the following invention as the manufacturing method of the piezoelectric and piezoelectric element of the present invention.

It is the manufacturing method of the piezoelectric which has a step of forming the electrodes on the substrate, a step of forming the first piezoelectric layer at least having a layer with the ratio of composition of at least one component to the other components being the slanted structure and a step of forming the second piezoelectric layer having the composition including the component of the slanted composition in a fixed proportion, wherein a dielectric constant $\in 1$ of the first piezoelectric layer at 25° C. and a dielectric constant $\in 2$ of the second piezoelectric layer at 25° C. are different.

A form of the manufacturing method of the piezoelectric element according to the present invention at least has the step of forming the electrodes on the substrate, the step of forming the first piezoelectric layer at least having a layer with the ratio of composition of at least one component to the other components being the slanted structure, the step of forming the second piezoelectric layer having the composition including the component of the slanted composition in a fixed proportion, a step of forming the second piezoelectric layer so that the dielectric constant $\in 1$ of the first piezoelectric layer at 25° C. and the dielectric constant $\in 2$ of the second piezoelectric layer at 25° C. are different, and a step of eliminating a part of the substrate.

Another form of the manufacturing method of the piezoelectric element according to the present invention at least has a step of forming the electrodes on the substrate, the step of forming the first piezoelectric layer at least having a layer with the ratio of composition of at least one component to the other components being the slanted structure, the step of forming the second piezoelectric layer having the composition including the component of the slanted composition in a fixed proportion, the step of forming the second piezoelectric layer so that the dielectric constant $\in 1$ of the first piezoelectric layer at 25° C. and the dielectric constant $\in 2$ of the second piezoelectric layer at 25° C. are different, a step of joining the piezoelectric layers to a second substrate, and the step of eliminating the first substrate.

It is possible, by these methods, to obtain the piezoelectric and piezoelectric element of good characteristics. In particular, it is possible to obtain a longer lasting element with no film peeling even when used as an actuator making use of mechanical displacement.

Next, the manufacturing method of the slanted structure portion according to the present invention will be described. In the case of making the slanted structure portion by sputter film-forming for instance, a portion in which the element to have the slanted composition is changed is made in a target, and that portion is shielded with a mask so as to change the area exposed to plasma and film-form the slanted structure portion. Or else, there is also a method of making the slanted structure portion while film-forming the substrate by moving it. In the case of MO-CVD film-forming, a method of increasing and decreasing a flow rate of an element gas to film-form the slanted structure portion is often adopted. In the case of sol-gel film-forming, it is sufficient to use a method of changing a composition concentration of each sol liquid for the film-forming and then applying it.

According to the present invention, it is possible to select other methods of suitably making the slanted structure portion as appropriate so as to obtain the dielectric, piezoelectric, piezoelectric element and ink jet head of the present invention.

The manufacturing method of the ink jet head according to the present invention at least has the step of forming the electrodes on the substrate, the step of forming the first piezoelectric layer at least having a layer with the ratio of composition of at least one component to the other components being the slanted structure, the step of forming the second piezoelectric layer having the composition including the component of the slanted composition in a fixed proportion, the step of forming the second piezoelectric layer so that the dielectric constant $\in 1$ of the first piezoelectric layer at 25° C. and the dielectric constant $\in 2$ of the second piezoelectric layer at 25° C. are different, and the step of eliminating a part of the substrate, a step of forming an ink passage and a step of forming an ink outlet.

It is also the manufacturing method of the ink jet head which at least has a step of forming the electrodes on the first substrate, the step of forming the first piezoelectric layer at least having a layer with the ratio of composition of at least one component to the other components being the slanted structure, the step of forming the second piezoelectric layer having the composition including the component of the slanted composition in a fixed proportion, the step of forming the second piezoelectric layer so that the dielectric constant ∈1 of the first piezoelectric layer at 25° C. and the dielectric constant ∈2 of the second piezoelectric layer at 25° C. are different, a step of joining the piezoelectric layers to the second substrate, the step of eliminating the first substrate, the step of forming an ink passage and the step of forming an ink outlet.

It is also the manufacturing method of the ink jet head which at least has the step of forming the electrodes on the first substrate, the step of forming the first piezoelectric layer at least having a layer with the ratio of composition of at least one component to the other components being the slanted structure, the step of forming the second piezoelectric layer having the composition including the component of the slanted composition in a fixed proportion, the step of forming the second piezoelectric layer so that the dielectric constant ∈1 of the first piezoelectric layer at 25° C. and the dielectric constant ∈2 of the second piezoelectric layer at 25° C. are different, the step of joining the piezoelectric layers to the second substrate, and the step of eliminating the first substrate, the step of forming an ink passage and the step of forming an ink outlet.

Figure 2:
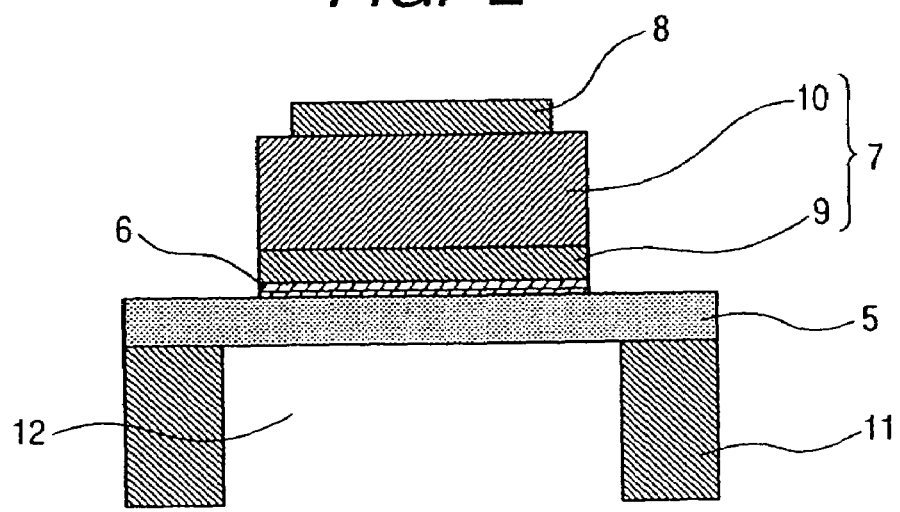
FIG. 2 is a sectional view of a piezoelectric element.
Figure 3A:
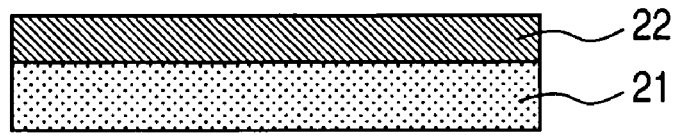
FIGS. 3A, 3B, 3C and 3D are schematic views showing a manufacturing process of a dielectric element according to the present invention.
Figure 3B:
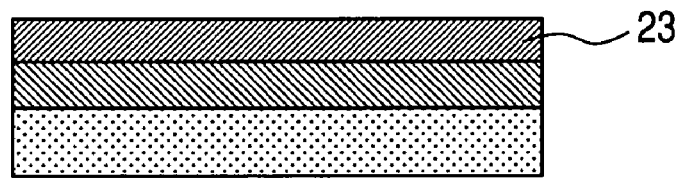
Figure 3C:
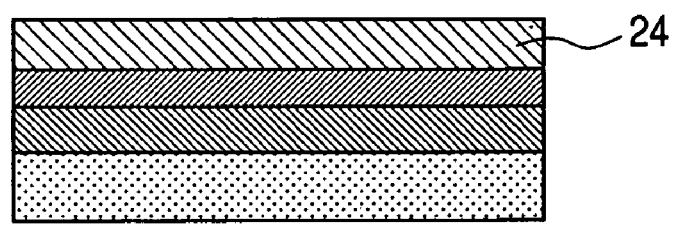
Figure 3D:
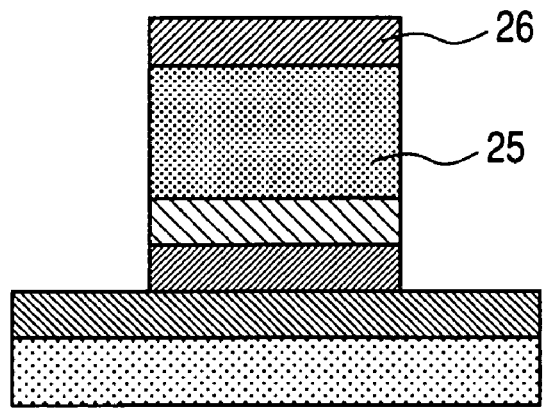

The ink jet head of the present invention will be described by referring to FIG. 1. FIG. 1 is a schematic view of an ink jet head, where reference numeral 1 denotes an outlet, 2 denotes a continuous hole (liquid path) connecting an individual liquid chamber 12 to the outlet 1, 4 denotes a common liquid chamber, 5 denotes a diaphragm, 6 denotes a lower electrode, 7 denotes a piezoelectric film (piezoelectric layer) and 8 denotes an upper electrode. The piezoelectric film 7 is rectangular as shown in FIG. 1. This shape may be elliptical, circular or parallelogrammatic other than the rectangular shape. The piezoelectric film 7 of the present invention will be further described by referring to FIG. 2. FIG. 2 is a sectional view of the piezoelectric film of FIG. 1 in a width direction. Reference numeral 9 denotes the first piezoelectric layer of the present invention, 10 denotes the second piezoelectric layer having a slope structure portion in the first layer, 5 denotes the diaphragm and 6 denotes the lower electrode. There may be a buffer layer for controlling the crystalline property between the diaphragm and lower electrode. The upper and lower electrodes may also have a multilayer configuration. While a cross-section of the piezoelectric film 7 comprised of 9 and 10 is represented as a rectangle, it may also be a trapezoid or an inverted trapezoid. Configuration order of 9 and 10 may also be upside down. The configuration of 9 and 10 may be reversed because of a device manufacturing method, and the effects of the present invention can be obtained likewise even when reversed.

The lower electrode 6 is drawn out up to a position at which no piezoelectric film 7 exists while the upper electrode is drawn out to an opposite side (not shown) to the lower electrode and is connected to a driving power supply. While FIGS. 1 and 2 show a state in which the lower electrode is patterned, it may also exist in a portion having no piezoelectric film.

The diaphragm 5 of the ink jet head of the present invention may be 0.5 μm to 10 μm thick, and preferably 1.0 μm to 6.0 μm thick. In the case where there is the buffer layer, this thickness includes that of the buffer layer. The film thickness of the electrode is 0.05 μm to 0.4 μm thick, and preferably 0.08 μm to 0.2 μm. A width Wa of an individual liquid chamber 12 (refer to FIG. 5) is 30 μm to 180 μm. A length Wb (refer to FIG. 5) is 0.3 mm to 6.0 mm depending on a discharged droplet amount. The shape of the outlet 1 is circular or star-shaped, and its diameter should preferably be 7 μm to 30 μm. It should preferably have a tapered shape expanded in two directions of the continuous hole. The length the continuous hole 2 should preferably be 0.05 mm to 0.5 mm. When exceeding this, discharging speed of droplets may be reduced. If less than this, the discharging speed of the droplets discharged from each outlet may vary widely.

The materials mainly used for the diaphragm are the oxides such as $ZrO_2$, $BaTiO_3$, MgO, STO and $MgAl_2O_4$ doped by rare-earth elements including Sc and Y and/or Si. Si may include a dopant element such as a B element. The diaphragm having these materials as its major components has a certain crystal structure which is specifically controlled. It is desirable that the crystal structure of (100), (110) or (111) be oriented at intensity of 80 percent or more, which should preferably be 99 to 100 percent. Here, "99 percent" means that there exists an orientation different from a main orientation by 1 percent of XRD intensity.

Electrode materials are metal materials or oxide materials. The metal materials are Au, Pt, Ni, Cr, Ir and so on, and may also be the laminated structure with Ti and Pb. The oxide materials are STO, SRO, $IrO_2$, $RuO_2$, $Pb_2Ir_2O_7$ and so on doped by La or Nb. As for these, it is desirable that at least one of the upper and lower electrodes have the above crystal structure. The materials and configurations of the upper and lower electrodes may be either the same or different. One of them becomes a common electrode and the other becomes a driving electrode.

Next, the manufacturing method of the present invention will be described. FIGS. 3A to 3D are a manufacturing process of the dielectric element according to the present invention. The present invention has at least a step of providing an electrode 23 on a substrate 21, a step of providing a first dielectric layer 24 thereon and a step of providing a second dielectric layer 25 thereon. It also has an upper electrode 26 as the dielectric element. The substrate 21 is an MgO, STO, $ZrO_2$, Si substrate and should preferably be a single-crystal substrate. They may include the dopant element.

The film-forming method of the first and second dielectric layers should be a sputter technique, an MO-CVD method, a laser ablation method, a sol-gel method, an MBE method and so on, which should desirably be the sputter technique, MO-CVD method and sol-gel method, and preferably the sputter technique.

As a step of providing the electrodes on the substrate 21, the electrode material is film-formed by orienting it in a specific direction. It is desirable to provide a buffer layer 22 for controlling orientation on the substrate before film-forming the electrodes. The material of the buffer layer should desirably be a material of which lattice constant matches with that of the substrate with a difference of 8 percent or less. For instance, the material of the buffer layer should desirably be the oxide which can be film-formed by the sputter technique, MO-CVD method and laser ablation method. For instance, it should be preferable that it be a cubical crystal or a pseudo-cubical crystal having the crystal structure of which lattice constant is 3.6 Å to 6.0 Å.

For instance, a concrete configuration may be $Zr_{0.97}Y_{0.003}O_2$ (100)/Si (100), $Zr_{0.97}Y_{0.03}O_2$ (111)/Si (111), $Zr_{0.97}Y_{0.03}O_2$ (110)/Si (110), $Zr_{0.7}Pr_{0.3}O_2$ (100)/Si (100), $Zr_{0.7}Pr_{0.3}O_2$ (111)/Si (111), $Zr_{0.7}Pr_{0.3}O_2$ (110)/Si (110), $SrTiO_3$ (111)/Si (100), $SrTiO_3$ (110)/Si (110), $SrTiO_3$ (100)/MgO (100), $SrTiO_3$ (111)/MgO (111), $MgAl_2O_4$ (100)/MgO (100), $BaTiO_3$ (001)/MgO (100) and so on. Here, the lattice constant of $Zr_{0.97}Y_{0.03}O_2$ is 5.16 Å, that of $Zr_{0.7}Pr_{0.3}O_2$ is 5.22 Å, that of $SrTiO_3$ is 3.91 Å, that of MgO is 4.21 Å, that of $MgAl_2O_4$ is 4.04 Å, that of $BaTiO_3$ is 3.99 Å, and that of Si is 5.43 Å. To calculate consistency of the lattice constant, taking $Zr_{0.97}Y_{0.03}O_2$ (111)/Si (111) for example, $Zr_{0.97}Y_{0.03}O_2$ (111) is $5.16 \times \sqrt{2} = 7.30$ Å, Si (111) is 5.43 Å$\sqrt{2} = 7.68$ Å so that a difference in the consistency is 4.9 percent, which proves to be good.

As for the electrodes to be provided on such a buffer layer, $Zr_{0.97}Y_{0.03}O_2$ (100) has Pt (111), Ir (111), $SrRuO_3$ (111), $Sr_{0.96}La_{0.04}TiO_3$ (111), $Sr_{0.97}Nb_{0.03}TiO_3$ (111), $BaPbO_3$ (111) and so on film-formed thereon. $Zr_{0.97}Y_{0.03}O_2$ (111) has Pt (100), Ir (100), $SrRuO_3$ (100), $Sr_{0.96}La_{0.04}TiO_3$ (100), $Sr_{0.97}Nb_{0.03}TiO_3$ (100), $BaPbO_3$ (100) and so on film-formed thereon. $Zr_{0.97}Y_{0.03}O_2$ (110) has Pt (110), Ir (110), $SrRuO_3$ (110), $Sr_{0.96}La_{0.04}TiO_3$ (110), $Sr_{0.97}Nb_{0.03}TiO_3$ (110), $BaPbO_3$ (110) and so on film-formed thereon. A system of $Zr_{0.7}Pr_{0.03}O_2$ is also film-formed by the same crystal system. $SrTiO_3$ (111) has a (111) films of Pt (111), Ir (111), $SrRuO_3$ (111), $Sr_{0.97}La_{0.03}TiO_3$ (111), $Sr_{0.97}Nb_{0.03}TiO_3$ (111), $BaPbO_3$ (111) and so on formed thereon. A (100) film has a (100) electrode film formed thereon, and a (110) film has a (110) electrode film formed thereon. $BaTiO_3$ (001) and $MgAl_2O_4$ (100) have (100) of the electrode films provided thereon.

As for examples of having the electrodes without the buffer layer on the substrate, there are Pt (111)/Ti/Si, Ir (111)/Ti/Si, $IrO_2$ (100)/MgO (100), $SrRuO_3$ (100)/$SrTiO_3$ (100), $SrRuO_3$ (111)/$SrTiO_3$ (111), Pt (100)/MgO (100), Pt (111)/MgO (111), Pt (110)/MgO (110), Ir (100)/MgO (100), Ru (100)/MgO (100) and so on.

The present invention can take any of the above configurations.

At least the first and second dielectric layers are film-formed on these lower electrodes. The upper electrode is provided after film-forming the second dielectric layer. The materials used for the dielectric layers are as previously described. It is desirable that the first dielectric layer be film-formed with a little excessive amount of a Pb component as the material. The second dielectric layer is film-formed by adding at least an element of one component to the other components of the first dielectric layer on condition that the ratio of composition of its material is increased in amount against a target ratio of composition by 50 to 150 mole percent. For instance, in the case where a target composition of the film is $[Pb (Mg_{1/3}Nb_{2/3})O_3]_{0.67}$—$[Pb_{(1-a)}A_aTiO_3]_{0.33}$, the target composition in the case of sputter film forming must have the $Pb_{(1-a)}A_aTiO_3$ component increased, such as $[Pb (Mg_{1/3}Nb_{2/3})O_3]_{0.67}$—$[Pb_{(1-a)}A_aTiO_3]_{0.66}$. These also apply to other materials. It is thereby possible to obtain a thin film per target ratio of composition so as to obtain the dielectric and piezoelectric of good characteristics. It is also a desirable form to excessively include lead in the material. For that reason, the lead is also included a little excessively in the dielectric layers and piezoelectric layers.

In the case of forming $Pb(Zn_{1-3}Nb_{2/3})O_3$ and $[Pb (Zn_{1/3}Nb_{2/3})O_3]x$-$[Pb_{(1-a)}A_aTiO_3]y$ layers, it is desirable to excessively include a Zn component in the material because the Zn component has low vapor pressure and can hardly be included in the film.

The material for the upper electrode may be either the same as or different from the aforementioned lower electrode material. The film-forming method is also as previously described. It is a desirable form to provide a cohesive layer and render the electrode layer as a multilayer structure in order to improve cohesiveness of the electrode layer.

Figure 10:
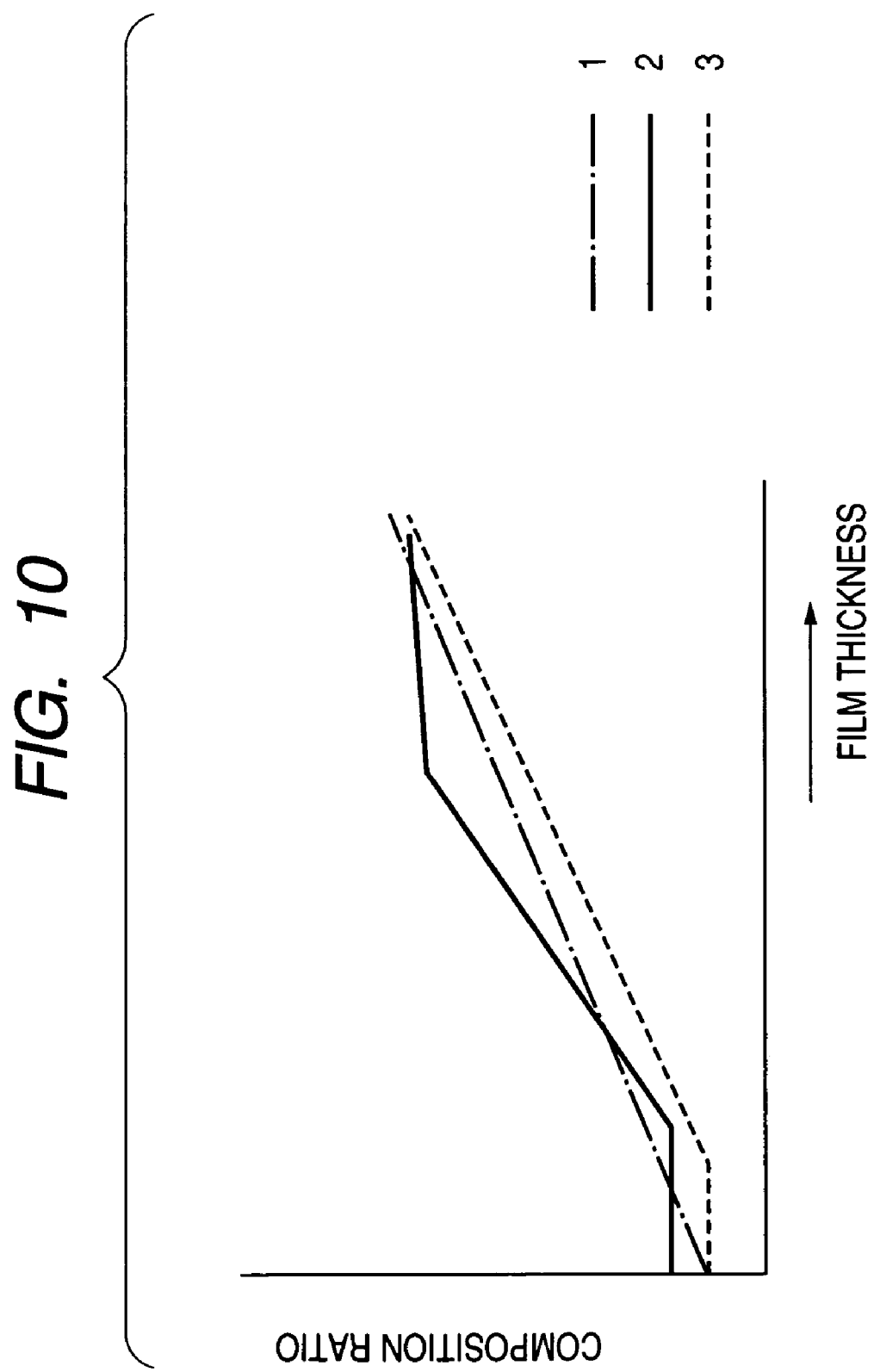
FIG. 10 is a diagram describing composition of a slanted structure portion of the present invention.

The composition of the slanted structure portion will be schematically described by using the drawings. In FIGS. 10 and 11, a horizontal axis is film thickness, and a vertical axis is a ratio of composition of a specific element. Positions of y-axis sections are different since they are purposely deviated for the sake of description. Line 1 of FIG. 10 shows the slanted structure portion increasing at a fixed rate, line 2 shows an example which becomes a layer with little change at a fixed rate in proximity to the second layer, and line 3 shows an example which has the layer of fixed composition in proximity to the electrode. Line 4 of FIG. 11 shows an example which has a plurality of phased layers, line 5 shows an example in which a plurality of layers of different rates of increase exist, and line 6 shows an example in which the composition changes on the electrode side while it is even on the second layer side. Not limited thereto, the present invention can achieve the film-forming of the second layer controllably because a slanted portion exists in the shown form in one of the portions in the first layer.

Next, the manufacturing method of the ink jet head of the present invention will be described. The manufacturing method of the present invention adopts two methods of providing the individual liquid chamber to be a pressure chamber on the substrate used on film-forming the dielectric and the method of providing the individual liquid chamber on another substrate.

Figure 4:
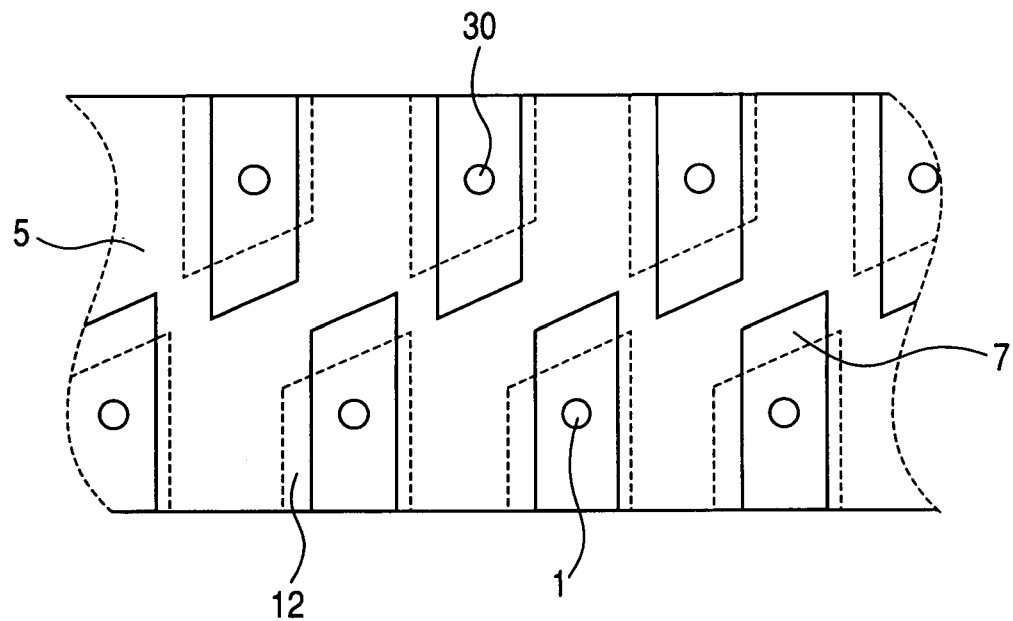
FIG. 4 is a plan view of the ink jet head.
Figure 5:
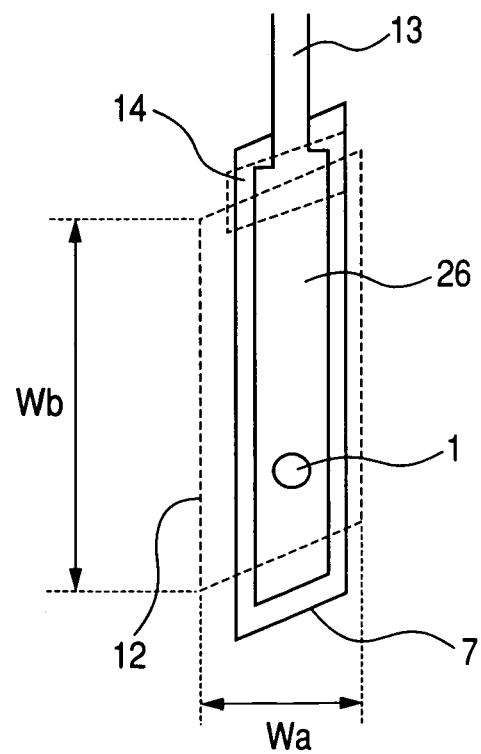
FIG. 5 is a plan view of an individual liquid chamber of the ink jet head.

The former method is the same as the manufacturing method of the dielectric up to the step of providing the piezoelectric layers, which further includes at least the step of eliminating a part of the substrate 21 and the step of forming the ink outlet. It forms the individual liquid chamber (12 of FIG. 1) by eliminating a part of the substrate. As for the manufacturing method of the individual liquid chamber, it can be manufactured by wet etching, dry etching or sand-milling of the substrate. A plurality of the individual liquid chambers are created on the substrate by a certain number of pitches. As shown in FIG. 4 showing a planar placement of the ink jet heads, it is a desirable form to have the individual liquid chambers 12 in staggered arrangement. In FIG. 4, an area of reference numeral 12 shown in broken line is the individual liquid chamber on which pressure is exerted, and reference numeral 7 is a patterned piezoelectric element portion. The piezoelectric film of this piezoelectric element portion is comprised of at least the first piezoelectric layer of the thin film, the second piezoelectric layer which is thicker and the upper electrode. Reference numeral 5 is the diaphragm portion and the lower electrode. Unlike the diaphragm, the lower electrode may be patterned as in FIGS. 3A to 3D. The shape of the individual liquid chamber is shown as a parallelogram in order to representatively show the shape in the case where a Si (110) substrate is used as the substrate and the individual liquid chamber is created by performing the wet etching with alkalis. It may also be a rectangle otherwise. In the case of the parallelogram shown in FIG. 5, it is also desirable to have the piezoelectric film patterned like a parallelogram in order to reduce a distance between the outlets 1 and 30. FIG. 5 shows a plan view of the entire individual liquid chamber, and the upper electrode 26 is joined to a drive circuit by using an area of reference numeral 13 extended from the individual liquid chamber 12. Reference numeral 14 is a restriction of a flow path from the common liquid chamber to the individual liquid chamber. The piezoelectric layer exists up to this portion in FIG. 5, which may also be otherwise.

The ink outlet is rendered as the element by the method of joining the substrate on which the outlet 1 is provided or joining the substrate on which the outlet 1 and continuous hole 2 are formed. As for the method of forming the outlet, it is formed by etching, machining or laser irradiation. The substrate on which the outlet is formed may be either the same as or different from the substrate on which the piezoelectric film is formed. When different, the substrate is selected from a SUS substrate, an Ni substrate and so on, where a difference in a thermal expansion coefficient from the substrate on which the piezoelectric film is formed can be selected from a material of $1 \times 10^{-6}/°$ C. to $1 \times 10^{-8}/°$ C.

The method of joining the substrate may be the method of using an organic adhesive. However, the method using metal junction with an inorganic material is preferable. The materials used for the metal junction are In, Au, Cu, Ni, Pb, Ti, Cr and so on, which are joinable at a low temperature of 250° C. or less and the difference in the thermal expansion coefficient from the substrate becomes smaller. Therefore, it is desirable because a problem due to warpage of the element can be avoided and there is no damage on the piezoelectric layers.

Next, the latter manufacturing method will be described.

The latter method is the method of transferring the piezoelectric film provided on the first substrate to the second substrate. It is the same as the method shown in FIGS. 3A to 3D until the piezoelectric layers are provided. However, the diaphragm 5 is film-formed on the upper electrode in a state of having no piezoelectric layer patterned so as to transfer it to the second substrate via the diaphragm. The second substrate has the individual liquid chambers 12, the continuous hole 2 and a common liquid chamber 4 formed thereon in the steps shown in FIGS. 6A to 6D for instance. FIG. 6A shows a step of forming a mask according to the individual liquid chamber on the second substrate. FIG. 6B shows a step of being processed by the etching and so on from the top (a shaded area represents a processed portion). FIG. 6C shows a step of eliminating the mask and creating the mask for the continuous hole 2. FIG. 6D shows a step of forming the continuous hole and common liquid chamber by processing the shaded area by means of the etching and so on. FIG. 6E schematically shows the state in which the individual liquid chamber, continuous hole and common liquid chamber are formed by eliminating the mask. FIG. 6F shows the state of joining the substrate having the outlet and a part of the common liquid chamber formed thereon. It is desirable that a substrate surface 16 having the outlet thereon have undergone a water-shedding process.

Figure 7:
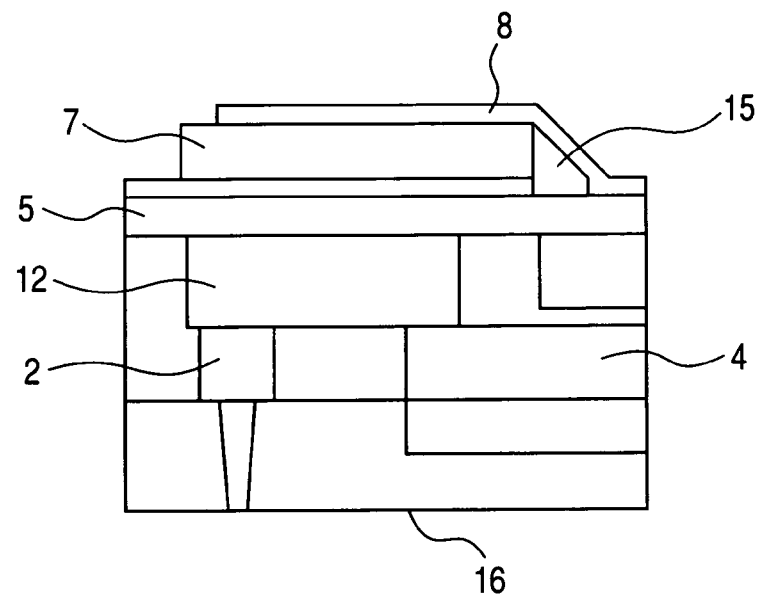
FIG. 7 is a longitudinal sectional view of the ink jet head.

The second substrate to be joined to the piezoelectric layer of the first substrate should be used in the state of FIG. 6E or FIG. 6F. FIG. 7 shows the state in which the first substrate is eliminated from the piezoelectric element and the piezoelectric layer is patterned after the joining. Order of lamination of a piezoelectric layer 7 from the diaphragm 5 side obtained by the latter manufacturing method in FIG. 7 is the order of the second piezoelectric layer and then the first piezoelectric layer. Reference numeral 8 is equivalent to the lower electrode provided on the first substrate. The positions of the lower and upper electrodes in the latter method are reverse to those of the former method.

Apart from the latter method, there is also the method of forming the diaphragm on the second substrate and transferring the piezoelectric layer thereon to eliminate the first substrate. The piezoelectric layer in that case may be either patterned or not patterned. In the case of adopting this step, it is desirable to use a metal junction layer as the lower electrode.

Hereunder, embodiments of the present invention will be described.

First Embodiment

A Pt (100) orientation film was formed in 120-nm thickness on an MgO (100) substrate, and the first dielectric layer of the present invention was formed thereon in 10-nm thickness at substrate temperature of 590° C. by means of magnetron sputtering by using a target of which composition is $Pb(Mg_{1/3}Nb_{2/3})O_3$ and the Pb amount is excessive by 10 mole percent. The first layer was formed thereon by sequentially changing a Ti element against lead by 5 to 25 mole percent. The film thickness of the entire first layer is 50 nm.

The second dielectric layer of a PMN-PT layer ($[Pb(Mg_{1/3}Nb_{2/3})O_3]_{0.67}$—$[PbTiO_3]_{0.33}$) was film-formed on the first layer at substrate temperature of 620° C., and the thin film of 100 nm with a good crystalline orientation was obtained. As for the target in this case, a green compact was used, which was created through heat treatment by mixing a powder of which $PbTiO_3$ component is excessive by 100 percent with a PMN powder. To be more specific, ($[Pb(Mg_{1/3}Nb_{2/3})O_3]_{0.67}$—$[PbTiO_3]_{0.66}$) was used as the target composition. The thin film of targeted ratio of compositions and good crystalline property could be obtained by the above operation. (001) crystalline orientation was 57 percent of peak intensity of 21.48 degrees of the XRD. The dielectric constant at 25° C. was 510 first dielectric layer, and the dielectric constant of the entire piezoelectric layers was 260 so that the dielectric constant of the second layer was calculated as 530. The dielectric constant became such a large value because the stress of the film was reduced and the site-B elements could move more easily. Thus, the voltage applied to the second dielectric layer was 1.9 times that applied to the first dielectric layer, and the voltage applied to the second dielectric layer at a 5 V drive was 3.3 V.

In the case of film-forming the $PbTiO_3$ by using $Pb_{0.7}La_{0.3}TiO_3$, film-forming temperature of the second layer could be reduced to 590° C., and the crystalline property of the film was also improved to 78 percent.

In the case of forming the second dielectric layer in 150-nm thickness, the crystalline property was further improved so as to obtain the second dielectric layer of the crystalline property of 78 percent. In this case, the voltage applied to the second dielectric layer was about 2.9 times so that the voltage of 3.7 V or more could be applied.

The PMN-PT layer was film-formed in 2.2-μm thickness by the above method. Furthermore, a Cr layer was formed thereon in 2.0-μm thickness by sputter film-forming. An Au layer was provided in 100-nm thickness on the Cr layer, and was joined by Pt metal junction to a Si (110) substrate on which the individual liquid chamber and continuous hole are provided as in FIG. 5. Thereafter, an MgO substrate was etching-eliminated by a mixed acid including acetic acid, nitric acid and ammonium chloride. The Pt layer, PMN layer and PMN-PT layer were etched in a dry process and patterned along the individual liquid chamber. The width and length of the individual liquid chamber are 6.0-μm and 1.8 mm, and the width and length of the piezoelectric layer placed thereon are 50-μm and 2.2 mm. The diameter of the continuous hole is 150 μmΦ, and a tapered shape of 30 to 12 μmΦ was used for the outlets. The ink jet head having 150 outlets placed at a density of 300 dpi a row was obtained. An aqueous solution of 3.5 cps was discharged by this head. It could be discharged with good performance of a droplet amount of 2.7 pl and discharge speed of 8.9 m/second. Variations in discharge speed of the outlets were ±2.9 percent. Resistance as a result of an endurance test was also good.

COMPARATIVE EXAMPLE 1

The second dielectric layer was film-formed as with the first embodiment except that the buffer layer used in the first embodiment was changed to the single-crystal $PbTiO_3$ layer. The PMN-PT layer included the pyrochlore phase, and so a good thin film could not be obtained. And the piezoelectric characteristics were poor when rendered thick-film as the piezoelectric layer.

Second to Sixth Embodiments

The ink jet head was created in the configuration described in Table 1 by changing the composition of each dielectric layer compared to the first embodiment. In any case, the thin film of a good (001) orientation could be obtained. However, the compositions in Table 1 are composition formulas. As a result of an ICP analysis, Pb is excessive in a range of 1.02 to 1.25, and the characteristics were especially good in that case. The ratio of compositions in the table are mole percentage values worth the lead of the slanted components for the lead. And the thickness of the first layer is the film thickness including the slanted structure portion.

$[Pb_{0.7}La_{0.3}TiO_3]_{0.6}$ and lead was excessive by 10 percent so as to obtain the piezoelectric layer of which second layer had the crystalline property of 89 percent in an (111) orientation. As with the first embodiment, it was rendered as the ink jet head by creating the individual liquid chambers to a handling layer of the SOI substrate. It was confirmed that this head has good characteristics with no problem such as film peeling. The dielectric constant $\in 1$ of this piezoelectric layer was 500, and the dielectric constant $\in 2$ of the second layer was 620. As for the diaphragm of the ink jet head in this case, Si (100) of the SOI layer functions as the diaphragm, and the $SiO_2$ layer functions as an etch stop layer on wet etching and a part of the diaphragm. (Eighth Embodiment)

The ink jet head was created by the method of creation in the seventh embodiment, where the piezoelectric layer was $Pb(Mg_{1/3}Nb_{2/3})O_3$ and the slanted structure portion has the Ti element increased from 8 to 33 percent so as to combine the entire film thickness of 0.1 μm with the second layer in 0.5-μm thickness indicated by the composition formula of $[Pb(Mg_{1/3}Nb_{2/3})O_3]_{0.67}$—$[Pb_{0.7}La_{0.3}TiO_3]_{0.33}$. The combined laminated layer was sequentially repeated as four layers so as to create the ink jet head as the piezoelectric layer which was 2.4 μm thick. An element having good

TABLE 1

| EXAMPLE | COMPOSITION OF FIRST LAYER ON THE SIDE OF ELECTRODE | ELEMENT OF SLANTED PORTION | COMPOSITION RATIO | THICKNESS OF FIRST LAYER | $\epsilon 1$ |
|---|---|---|---|---|---|
| 2 | $Pb(Zn_{1/3}Nb_{2/3})O_3$ | La | 0.5~2.0% | 0.06 μm | 660 |
|   |   | Ti | 0.5~7.0% |   |   |
| 3 | $Pb(Sc_{1/2}Nb_{1/2})O_3$ | Ti | 2.0~35% | 0.1 μm | 740 |
| 4 | $Pb(Sc_{1/2}Ta_{1/2})O_3$ | Ti | 2.0~8.0% | 0.15 μm | 480 |
| 5 | $Pb(In_{1/2}Nb_{1/2})O_3$ | Ti | 5~36% | 0.05 μm | 780 |
| 6 | $Pb(Ni_{1/3}Nb_{2/3})O_3$ | Ca | 0.5~1.0% | 0.2 μm | 550 |
|   |   | Ti | 2.0~22% |   |   |

| EXAMPLE | COMPOSITION OF SECOND LAYER | THICKNESS OF SECOND LAYER | $\epsilon 2$ | TARGET COMPOSITION OF SECOND LAYER | ORIENTATION (%) |
|---|---|---|---|---|---|
| 2 | $[Pb_{0.97}La_{0.03}(Zn_{1/3}Nb_{2/3})O_3]_{0.91}$—$[PbTiO_3]_{0.09}$ | 2.8 μm | 700 | $[Pb_{0.97}La_{0.03}(Zn_{1/3}Nb_{2/3})O_3]_{0.91}$—$[PbTiO_3]_{0.14}$ | 60 |
| 3 | $[Pb(Sc_{1/2}Nb_{1/2})O_3]_{0.55}$—$[PbTiO_3]_{0.45}$ | 2.5 μm | 680 | $[Pb(Sc_{1/2}Nb_{1/2})O_3]_{0.55}$—$[PbTiO_3]_{0.72}$ | 95 |
| 4 | $[Pb(Sc_{1/2}Ta_{1/2})O_3]_{0.55}$—$[PbTiO_3]_{0.45}$ | 1.9 μm | 530 | $[Pb(Sc_{1/2}Ta_{1/2})O_3]_{0.55}$—$[PbTiO_3]_{0.8}$ | 40 |
| 5 | $[Pb(In_{1/2}Nb_{1/2})O_3]_{0.64}$— | 2.5 μm | 800 | $[Pb(In_{1/2}Nb_{1/2})O_3]_{0.64}$— | 98 |
| 6 | $[Pb_{0.96}Ca_{0.04}(Ni_{1/2}Nb_{1/2})O_3]_{0.7}$—$[PbTiO_3]_{0.3}$ | 2.5 μm | 650 | $[Pb_{0.96}Ca_{0.04}(Ni_{1/2}Nb_{1/2})O_3]_{0.7}$—$[PbTiO_3]_{0.7}$ | 85 |

Seventh Embodiment

A YSZ (100) layer was film-formed in 0.1-μm thickness on the SOI layer by using the SOI substrate of which SOI (100) layer is 2 μm thick, $SiO_2$ layer is 0.2 μm thick, handling layer Si (110) is 650 μm thick. An Ir (111) single-orientation film of 0.15 μm was formed thereon, the electrode-side composition of the first layer was $Pb(Mg_{1/3}Nb_{2/3})O_3$ and the slanted structure portion had the Ti element increased from 8 to 33 percent so that the entire film thickness was 0.2 μm. The second layer indicated by the composition formula of $[Pb(Mg_{1/3}Nb_{2/3})O_3]_{0.67}$—$[Pb_{0.7}La_{0.3}TiO_3]_{0.33}$ was film-formed thereon in 2.5-μm thickness. The first layer was film-formed by using the target of which Pb component was excessive by 15 percent, and the second layer was film-formed by using the target of which composition was $[Pb(Mg_{1/3}Nb_{2/3})O_3]_{0.67}$— crystalline property of the piezoelectric film was obtained, and its characteristics as the device were also good.

This application claims priority from Japanese Patent Application No. 2004-055549 filed on Feb. 27, 2004, which is hereby incorporated by reference herein.

What is claimed is:

1. A dielectric element having a dielectric layer provided between an upper electrode layer and a lower electrode layer, wherein:

the dielectric layer has a first dielectric layer formed of a perovskite oxide and a second dielectric layer formed of a perovskite oxide, the second dielectric layer is a layer mainly composed of an oxide formed of four or more metal element components while in the first dielectric layer at least one component of the four or more metal element components is substantially non-existent in proximity to one of the upper electrode layer and the lower electrode layer, the first dielectric layer is mainly composed of an oxide formed by the remaining three or more metal element components, and the composition of at least one component of the first dielectric layer changes in a thickness direction of the first dielectric layer in proximity to a boundary between the first dielectric layer and the second dielectric layer.

2. The dielectric element according to claim 1, wherein $t_2 > 2 \times t_1$, where $t_1$ is the film thickness of a portion of the first dielectric layer the composition of which changes and $t_2$ is the film thickness of the second dielectric layer.

3. The dielectric element according to claim 1, wherein a difference between lattice constants of the first and second dielectric layers on a boundary surface therebetween is within ±4 percent.

4. The dielectric element according to claim 1, wherein a major component of the dielectric layer is a perovskite oxide.

5. The dielectric element according to claim 4, wherein the perovskite oxide is a relaxer oxide.

6. The dielectric element according to claim 5, wherein components of the relaxer oxide include at least Pb and Ti, and further include at least one kind selected from Mg, Zn, Sc, Ni, Ta, Nb and In.

7. The dielectric element according to claim 1, wherein a major component of the first dielectric layer is an oxide indicated by $Pb(Mg_{1/3}Nb_{2/3})O_3$, and a major component of the second dielectric layer is an oxide indicated by $[Pb(Mg_{1/3}Nb_{2/3})O_3]x-[Pb_{(1-a)}A_aTiO_3]y$ (provided that A is an element selected from La and Ca, a is 0 to 0.3, x is 0.5 to 0.8, and y is 0.2 to 0.5).

8. The dielectric element according to claim 1, wherein a major component of the first dielectric layer is an oxide indicated by $Pb(Zn_{1/3}Nb_{2/3})O_3$, and a major component of the second dielectric layer is an oxide indicated by $[Pb(Zn_{1/3}Nb_{2/3})O_3]x-[Pb_{(1-a)}A_aTiO_3]y$ (provided that A is an element selected from La and Ca, a is 0 to 0.3, x is 0.7 to 0.97, and y is 0.03 to 0.3).

9. The dielectric element according to claim 1, wherein a major component of the first dielectric layer is an oxide indicated by $Pb(Sc_{1/2}Nb_{1/2})O_3$, and a major component of the second dielectric layer is an oxide indicated by $[Pb(Sc_{1/2}Nb_{1/2})O_3]x-[Pb_{(1-a)}A_aTiO3]y$ (provided that A is an element selected from La and Ca, a is 0 to 0.3, x is 0.4 to 0.7, and y is 0.3 to 0.6).

10. The dielectric element according to claim 1, wherein a major component of the first dielectric layer is an oxide indicated by $Pb(Ni_{1/3}Nb_{2/3})O_3$, and a major component of the second dielectric layer is an oxide indicated by $[Pb(Ni_{1/3}Nb_{2/3})O_3]x-[Pb_{(1-a)}A_aTiO3]y$ (provided that A is an element selected from La and Ca, a is 0 to 0.3, x is 0.6 to 0.9, and y is 0.1 to 0.4).

11. The dielectric element according to claim 1, wherein a major component of the first dielectric layer is an oxide indicated by $Pb(In_{1/2}Nb_{1/2})O_3$, and a major component of the second dielectric layer is an oxide indicated by $[Pb(In_{1/2}Nb_{1/2})O_3]x-[Pb_{(1-a)}A_aTiO_3]y$ (provided that A is an element selected from La and Ca, a is 0 to 0.3, x is 0.3 to 0.8, and y is 0.2 to 0.7).

12. The dielectric element according to claim 1, wherein a major component of the first dielectric layer is an oxide indicated by $Pb(Sc_{1/2}Ta_{1/2})O_3$, and a major component of the second dielectric layer is an oxide indicated by $[Pb(Sc_{1/2}Ta_{1/2})O_3]x-[Pb_{(1-a)}A_aTiO_3]y$ (provided that A is an element selected from La and Ca, a is 0 to 0.3, x is 0.4 to 0.8, and y is 0.2 to 0.6).

13. The dielectric element according to claim 1, wherein the first and second dielectric layers are single-crystallized layers, single-orientation layers or preference-orientation layers.

14. A piezoelectric element comprising a dielectric element according to claim 1.

15. An ink jet head comprising the piezoelectric element according to claim 14, wherein ink is discharged by using the piezoelectric element.

16. An ink jet recording apparatus comprising the ink jet head according to claim 15, wherein it perfonns recording by using the ink jet head.

* * * * *

UNITED STATES PATENT AND TRADEMARK OFFICE
CERTIFICATE OF CORRECTION

PATENT NO. : 7,301,261 B2 Page 1 of 1
APPLICATION NO. : 11/062619
DATED : November 27, 2007
INVENTOR(S) : Ifuku et al.

It is certified that error appears in the above-identified patent and that said Letters Patent is hereby corrected as shown below:

COLUMN 20:
Line 4, "0.4to 0.7," should read --0.4 to 0.7,--.
Line 37, "perfonns" should read --performs--.

Signed and Sealed this

Twenty-first Day of April, 2009

JOHN DOLL
*Acting Director of the United States Patent and Trademark Office*